(12) United States Patent
Lee

(10) Patent No.: US 7,180,809 B2
(45) Date of Patent: Feb. 20, 2007

(54) REFRESH CONTROL CIRCUIT OF PSEUDO SRAM

(75) Inventor: Yin Jae Lee, Kyeongki-do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 11/126,420

(22) Filed: May 11, 2005

(65) Prior Publication Data

US 2006/0146626 A1    Jul. 6, 2006

(30) Foreign Application Priority Data

Dec. 30, 2004    (KR) .................. 10-2004-0117048

(51) Int. Cl.
*G11C 7/00* (2006.01)

(52) U.S. Cl. .................. 365/222; 365/230.03

(58) Field of Classification Search ................ 365/222, 365/230.03
See application file for complete search history.

(56) References Cited

U.S. PATENT DOCUMENTS

| | | | |
|---|---|---|---|
| 5,796,669 A * | 8/1998 | Araki et al. ................ 365/222 | |
| 6,449,685 B1 | 9/2002 | Leung | |
| 6,633,952 B2 | 10/2003 | Winograd et al. | |
| 2001/0007538 A1 | 7/2001 | Leung | |
| 2002/0008558 A1 * | 1/2002 | Okuda et al. ................ 327/175 | |
| 2002/0056022 A1 | 5/2002 | Leung | |
| 2004/0034735 A1 | 2/2004 | Winograd et al. | |
| 2005/0068826 A1 * | 3/2005 | Hoehler ................ 365/203 | |

FOREIGN PATENT DOCUMENTS

| | | |
|---|---|---|
| JP | 2260195 | 10/1990 |
| JP | 10247384 | 9/1998 |
| JP | 2003016782 | 1/2003 |

* cited by examiner

*Primary Examiner*—Amir Zarabian
*Assistant Examiner*—Kretelia Graham
(74) *Attorney, Agent, or Firm*—Marshall, Gerstein & Borun LLP

(57) ABSTRACT

Disclosed herein is a refresh control circuit of a pseudo SRAM. According to the present invention, a single bank select signal for performing a refresh operation on one bank in a period where a chip select signal is enabled, or until a period before a time for reading or writing one data elapses after the chip select signal is disabled is enabled. An all-bank select signal for performing the refresh operation on all the banks in a period after a time for reading or writing one data elapses after the chip select signal is disabled is enabled. Thus, the refresh operation is performed on one bank or all the banks at the same time depending upon the single bank select signal or the all-bank select signal.

20 Claims, 8 Drawing Sheets

REFRESH CONTROL CIRCUIT OF PSEUDO SRAM

BACKGROUND

1. Technical Field

A pseudo SRAM device is disclosed, and more specifically, to a refresh control circuit of a pseudo SRAM, wherein power consumption in the standby mode can be conserved.

2. Discussion of Related Art

Generally, a RAM (Random Access Memory) is a memory to store data within memory cells, and can be classified into a SRAM (Static RAM) and a DRAM (Dynamic RAM; DRAM). SRAM cells have a static latching structure consisting of six transistors or a combination of four transistors and two resistors. The data can be stored indefinitely if supplied with power. DRAM cells have a structure including a capacitor and an access transistor.

The pseudo SRAM is a memory that internally and automatically performs a refresh operation on memory cells without an external control and has a similar interface and operational timing as those of a SRAM in terms of its function. Like DRAM cells, pseudo SRAM cells have cells that include an access transistor and a capacitor. The pseudo SRAM, like DRAM cells, includes a refresh related circuit, unlike existing SRAM cells.

In a pseudo SRAM, data stored as electric charges is accumulated on a capacitor. The data may be lost because initial capacitor charges stored can be lost due to various causes such as leakage current. In order to prevent this, the data stored within a memory cell should be read before the data can be lost, and the memory cell should be re-charged with initial charges according to read information. Only if this operation is repeated regularly can the storage of data be maintained. Such a recharging process of cell is called a "refresh" operation.

In the conventional pseudo SRAM, refresh is performed with refresh control being carried out on a bank basis. If one word line performs an access operation in any one bank, other banks can perform nothing operation. Furthermore, a cell array is generally comprised of four banks. One bank includes four word lines. Accordingly, if a cell array has a refresh period of 256 ms, an oscillator has to be designed to have a period of 16 µs in order to refresh 16K word lines and, the current in a standby mode is consumed at a period of 16 µs. An average current at this time is current consumption at a standby mode. Current consumption in a standby mode is very important since a pseudo SRAM is used for mobile devices. An increase in current consumption causes to degrade the yield of mass production.

If the refresh period is quadrupled to reduce the current consumption in the standby mode, the number of word lines to be refreshed during a refresh period of 256 ms is also quadrupled. However, problems can arise because the internal power becomes lower than original design rule due to excessive current consumption, and the amount of the charges in the restored cells is thus reduced. This requires the refresh period to be shortened. In this case, the period has to be reduced again, which leads to an increase in the current of the standby mode.

SUMMARY OF THE DISCLOSURE

In view of the above problems, a refresh control circuit of a pseudo SRAM is disclosed wherein power consumption in a standby mode is reduced.

A disclosed refresh control circuit in a pseudo SRAM including a plurality of banks having a plurality of unit cells, the refresh control circuit comprising:

a chip select signal for selecting or not selecting a memory chip;

an input buffer for buffering the chip select signal;

a buffer enable control unit that outputs a chip select internal control signal having an opposite phase to that of the chip select signal in response to the output signal of the input buffer; and a bank selection unit for determining whether to perform a refresh operation on one bank or all the banks in response to the output signal of the buffer enable control unit;

wherein the bank selection unit enables a single bank select signal for performing a refresh operation on one bank in a period where the chip select signal is enabled or until a period before a time for reading or writing one data elapses after the chip select signal is disabled; and enables an all-bank select signal for performing the refresh operation on all the banks in a period after a time for reading or writing one data elapses after the chip select signal is disabled; and wherein the refresh operation is performed on one bank or all the banks at the same time depending upon the single bank select signal or the all-bank select signal.

The bank selection unit can comprise:

a first inverter that receives the chip select internal control signal;

a delay unit that delays the output signal of the first inverter as much as a time for reading or writing at least one data;

a NAND gate that logically combines the output signals of the first inverter and the delay unit;

a second inverter that uses the output signal of the NAND gate to produce the all-bank select signal; and a third inverter that inverts the output signal of the second inverter to produce the single bank select signal.

The pseudo SRAM can comprise:

a unit period oscillator for generating a clock having a unit period;

a first period multiplier that multiplies the clock output from the unit period oscillator to produce a clock having a first period;

a second period multiplier that multiplies the clock output from the unit period oscillator to produce a clock having a second period greater than the first period;

a pulse generator that outputs a pulse in response to the output clock of the first period multiplier, the single bank select signal, the output clock of the second period multiplier and the all-bank select signal; and a refresh control unit that outputs a refresh start signal informing the start of the refresh operation in response to the pulse generator;

wherein the pulse generator outputs the pulse having the first period if the single bank select signal is enabled and outputs the pulse having the second period if the all-bank select signal is enabled.

The first multiplier can be a multiplier that outputs a clock having a period in which a unit period is multiplied by 16, and the second multiplier can be a multiplier that outputs a clock having a period in which a unit period is multiplied by 64.

The pulse generator can comprise:

a first NAND gate for logically combining the single bank select signal and the output clock of the first multiplier, and for outputting the result;

a second NAND gate for logically combining the all-bank select signal and the output clock of the second multiplier, and for outputting the result;

a third NAND gate for logically combining the output signal of the first NAND gate and the output signal of the second NAND gate, and for outputting the result;

a plurality of odd-numbered inverters that receive the output signal of the third NAND gate;

a fourth NAND gate for logically combining the output signal of the third NAND gate and the output signal of a last inverter among the plurality of the odd-numbered inverters; and an inverter for inverting the output signal of the fourth NAND gate to produce a pulse.

The pseudo SRAM can further comprise:

a bank control unit that outputs bank control signals informing banks to be refreshed in response to counter output signals output from a refresh counter, the refresh start signal and the all-bank select signal;

wherein the bank control unit enables a bank control signal corresponding to a bank to be refreshed among the bank control signals if the single bank select signal is enabled and enables the entire bank control signals if the all-bank select signal is enabled;

whereby a refresh operation is performed depending upon the bank control signals output from the bank control unit.

The bank control unit can comprise:

a first PMOS transistor controlled according to the refresh start signal and connected between a power supply voltage terminal and a first node;

a first NMOS transistor controlled according to the counter output signal and connected between the first node and a second node;

a second NMOS transistor controlled according to the counter output signal and connected between the second node and a third node;

a third NMOS transistor controlled according to the refresh start signal and connected between the third node and a ground voltage terminal;

a second PMOS transistor controlled according to an inverted signal of a voltage level of the first node and connected between a power supply voltage terminal and the first node;

a fourth NMOS transistor controlled according to the all-bank select signal and connected between the first node and the third node; and an inverter that inverts the output signal of the fifth node to produce the bank control signals.

DETAILED DESCRIPTION OF PREFERRED EMBODIMENTS

A pseudo SRAM has a unit cell including a capacitor and a transistor. A plurality of cell arrays consists of a plurality of banks having the plurality of the unit cells. A memory cell array is generally comprised of four banks each having 4 k word lines. Accordingly, if a cell array has a refresh period of 256 ms, an oscillator has to be designed to have a period of 16 μs to refresh 16K word lines.

When a chip is disabled for a lengthy period to reduce the standby current in a pseudo SRAM, a refresh is performed on all the banks. Upon active operation or when a chip is disabled for a short period, the refresh is performed on only one bank. Refresh of the pseudo SRAM is carried out on a bank basis. If chip enable is long, a refresh operation is performed by enabling a total of four word lines one by one for each bank at the same time when once refresh is performed. By doing so, the refresh period can be quadrupled. In this case, there is an advantage in that current consumption of a standby mode can be saved by reducing the operation of peripheral circuits by one quarter in the same amount of time.

Excessive current consumption is, however, expected for four word line access operations. Since a refresh is performed with a sufficient time interval in a standby mode, it is less influenced by voltage drop. In an active operation, however, the device is directly influenced because a read or write operation is carried out right after the refresh operation. As a solution to solve this problem, an operation to have access to only one word line can be performed. This can solve the problem since voltage drop does not occur. As such, when a chip is disabled for a short period of time, the refresh is performed only one bank in order not to affect the active operation.

Furthermore, in order to produce a control signal capable of reducing the current in a standby mode, a chip select signal /CS1 is used. In order to prevent problems from occurring when the chip select signal /CS1 is disabled shortly, four banks are refreshed at the same time only when a signal that is disabled over 1 period is sensed. In order to reduce the standby current, a circuit is constructed in such a manner that refresh is performed on all the banks after over one read and write period elapse after chip enabling.

In a pseudo SRAM, after the chip select signal /CS1 is disabled and a chip is thus disabled, a refresh operation is performed by quadrupling banks to be refreshed and also increasing the refresh period from 16 μs to 64 μs four times after over one read and write period time (e.g., 200 ns).

Figure 1:
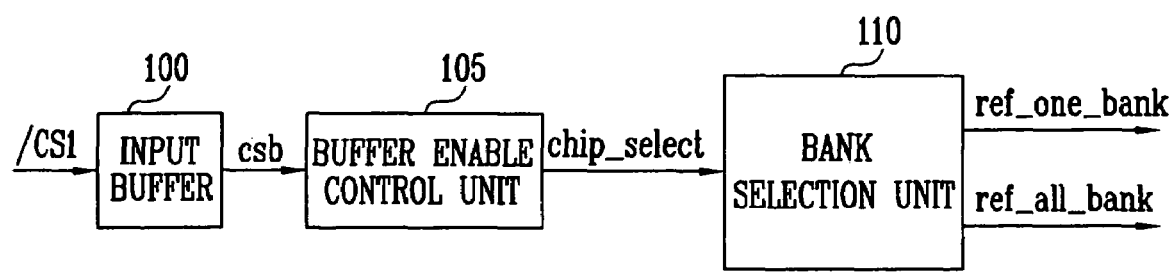
FIG. 1 is a block diagram showing a device that generates bank select signals for selecting a bank to be refreshed according to a preferred embodiment.

FIG. 1 is a block diagram of a device that generates bank select signals for selecting banks to be refreshed according to a preferred embodiment.

A chip select signal /CS1 is input to an input buffer 100. The input buffer 100 outputs a signal csb in which the chip select signal /CS1 is buffered. The chip select signal /CS1 is an external input signal that selects or not selects a chip. A buffer enable control unit 105 outputs a chip select internal control signal chip_select using the output signal csb of the input buffer 100. The chip select internal control signal chip_select is an internal control signal to select a chip, and has an opposite phase to that of the chip select signal /CS1. If the chip select signal /CS1 is logic high, the chip select internal control signal chip_select has logic low. The chip select internal control signal chip_select is input to a bank selection unit 110 for selecting banks to be refreshed. The bank selection unit 110 uses the chip select internal control signal chip_select to output a single bank select signal ref_one_bank for selecting only one bank to be refreshed, and an all-bank select signal ref_all_bank for selecting all the banks (in the present embodiment, four banks) to be refreshed at the same time. The bank selection unit 110 determines whether to perform a refresh operation on one bank only or all the banks at the same time in response to the output signal of the buffer enable control unit 105.

After the chip is disabled, the all-bank select signal ref_all_bank being a signal that controls all the banks to be refreshed is enabled after a predetermined time (e.g., 200 ns) elapses. If the all-bank select signal ref_all_bank is enabled, the single bank select signal ref_one_bank being a signal that controls only one bank to be refreshed is disabled at the same time. After the chip is disabled, the single bank select signal ref_one_bank being a signal that controls only one bank to be refreshed before a predetermined time (e.g. 200 ns) elapses is enabled.

As such, the bank selection unit 110 enables the single bank select signal ref_one_bank for performing a refresh operation on one bank in a period where the chip select signal /CS1 is enabled, or a period before a time for reading or writing one data elapses after the chip select signal /CS1 is disabled, and outputs the enabled signal. The bank selection unit 110 also enables the all-bank select signal ref_all_bank for performing a refresh operation on all the banks at the same time in a period where a time for reading or writing one data elapses after the chip select signal /CS1 is disabled, and outputs the enabled signal. Thereby, the refresh operation is performed on one bank or all the banks at the same time depending upon the single bank select signal ref_one_bank or the all-bank select signal ref_all_bank.

Figure 2:
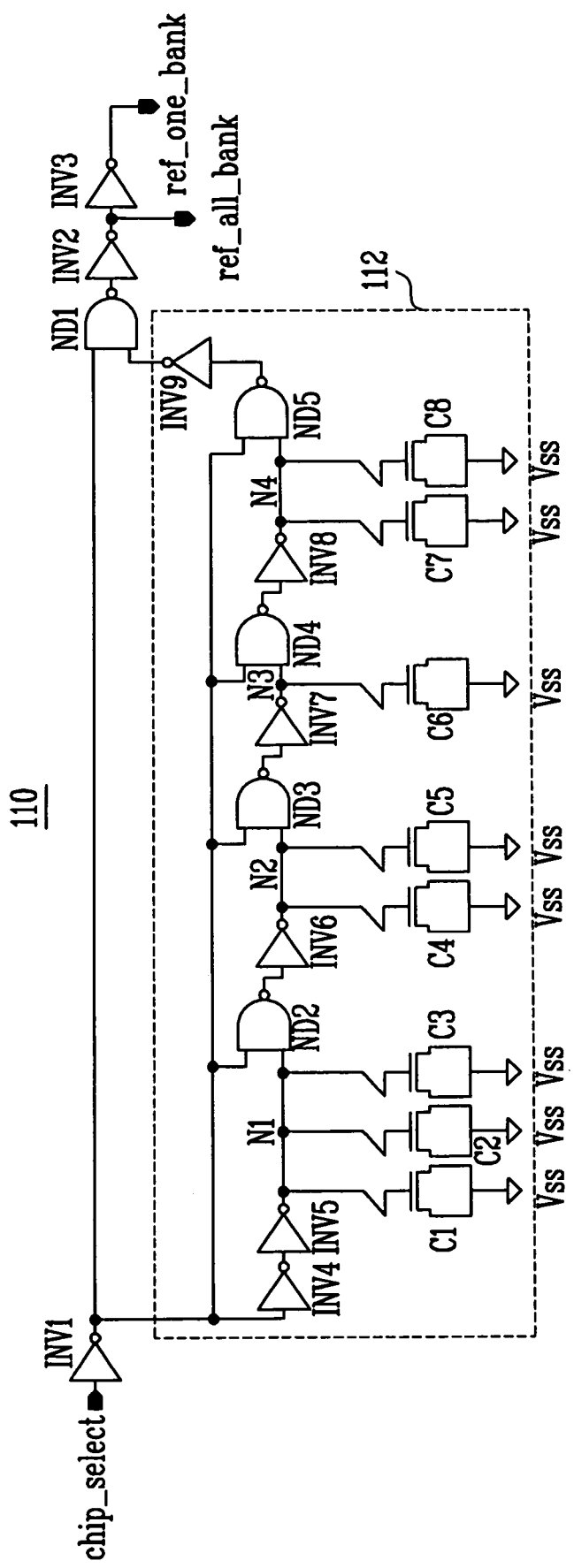
FIG. 2 is a circuit diagram of a bank selection unit shown in FIG. 1.

FIG. 2 is a circuit diagram of the bank selection unit 110 shown in FIG. 1. Referring to FIG. 2, the bank selection unit 110 includes an inverter INV1 that receives the chip select internal control signal chip_select, a delay unit 112 that receives the output signal of the inverter INV1, a logic element ND1 that logically combines the output signals of the inverter INV1 and the delay unit 112, an inverter INV2 that outputs an all-bank select signal using the output signal of the logic element ND1, and an inverter INV3 that inverts the output signal of the inverter INV2 to output the single bank select signal ref_one_bank.

The logic element ND1 can be a NAND gate. The delay unit 112 serves to delay a time of over one read or write period, e.g., about 200 ns. The delay unit 112 includes NAND gates ND2, ND3, ND4 and ND5 to which the output signal of the inverter INV is input. The output signal of the inverter INV1 is input to one input terminal of the NAND gate ND2 via inverters INV4, INV5. At least one capacitor (e.g., C1, C2 and C3) can be connected between a node N1 between the output terminal of the inverter INV5 and one input terminal of the NAND gate ND2, and ground terminals Vss in a parallel manner.

The capacitors C1, C2 and C3 serve to delay the output signal of the inverter INV5 as much as a charge time due to a difference in the amount of charges between the node N1 and the ground terminal Vss. A switch for controlling the delay time can be disposed between the node N1 and each of the capacitors C1, C2 and C3. The NAND gate ND2 performs a NAND operation on the output signal of the inverter INV1 and the output signal of the inverter INV5. The output signal of the NAND gate ND2 is inverted by an inverter INV6, and is then input to one input terminal of the NAND gate ND3.

At least one capacitor (e.g., C4 and C5) can be connected between a node N2 between the output terminal of the inverter INV6 and one input terminal of the NAND gate ND3, and the ground terminal Vss in a parallel manner. The capacitors C4, C5 serve to delay the output signal of the inverter INV6 as much as a charge time due to a difference in the amount of charges between the node N2 and the ground terminal Vss.

A switch for controlling the delay time can be disposed between the node N2 and each of the capacitors C4, C5. The NAND gate ND3 performs a NAND operation on the output signal of the inverter INV1 and the output signal of the inverter INV6. The output signal of the NAND gate ND3 is input to one input terminal of the NAND gate ND4 through an inverter INV7. At least one capacitor (e.g., C6) can be connected between a node N3 between the output terminal of the inverter INV7 and one input terminal of the NAND gate ND4, and a ground terminal Vss in a parallel manner. The capacitor C6 serves to delay the output signal of the inverter INV7 as much as a charge time due to a difference in the amount of charges between the node N3 and the ground terminal Vss. A switch for controlling the delay time can be disposed between the node N3 and the capacitor C6.

The NAND gate ND4 performs a NAND operation on the output signal of the inverter NV1 and the output signal of the inverter INV7. The output signal of the NAND gate ND4 is input to one input terminal of the NAND gate ND5 through an inverter INV8. At least one capacitor (e.g., C7, C8) can be connected between a node N4 between the output terminal of the inverter INV8 and one input terminal of the NAND gate ND5, and a ground terminal Vss in a parallel manner. The capacitors C7, C8 serve to delay the output signal of the inverter INV8 as much as a charge time due to a difference in the amount of charges between the node N4 and the ground terminal Vss. A switch for controlling the delay time can be disposed between the node N4 and each of the capacitors C7, C8. The NAND gate ND5 performs a NAND operation on the output signal of the inverter INV1 and the output signal of the inverter INV8. The output signal of the NAND gate ND5 is input to one input terminal of the NAND gate ND 1 through an inverter INV9.

Figure 7:
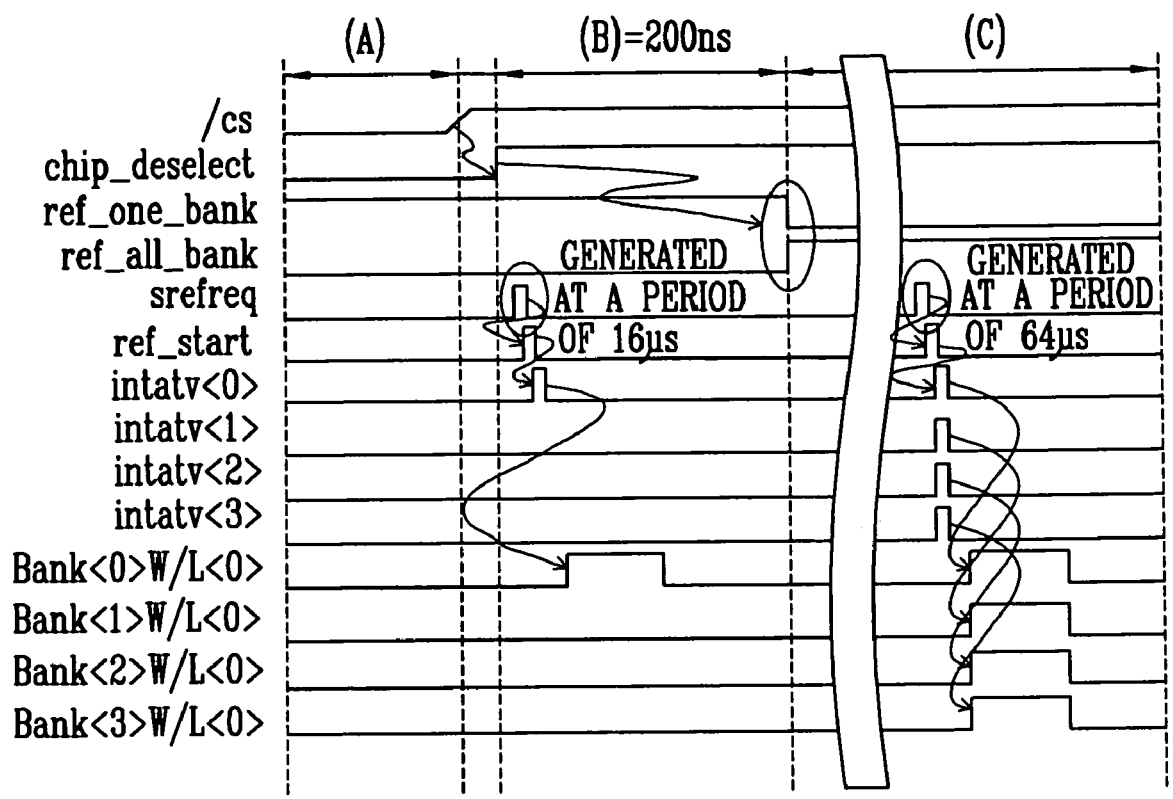
FIG. 7 shows an operational timing for controlling refresh according to a preferred embodiment.

The operation of the bank selection unit will now be described with reference to FIGS. 1, 2 and 7. FIG. 7 shows an operational timing for controlling refresh according to a preferred embodiment. If the chip select signal /CS1 is enabled low, the chip select internal control signal chip_select is logic high. The chip select internal control signal chip_select of logic high is inverted by the inverter INV1, and is then input to one input terminal of the NAND gate ND1. The NAND gate ND1 always outputs a signal of logic high regardless of the level of the voltage level of the delay unit 112 since the signal of logic low is input. Accordingly, the all-bank select signal ref_all_bank is disabled low since the output signal of the NAND gate ND1 is inverted by the inverter INV2. Meanwhile, the single bank select signal ref_one_bank is enabled high since the output signal of the NAND gate ND1 experiences the inverters INV2, INV3.

If the chip select signal /CS1 is disabled high, the chip select internal control signal chip_select becomes a logic low. The chip select internal control signal chip_select is inverted by the inverter INV1, and is then input to one input terminal of the NAND gate ND1. Since the output signal of the inverter INV1 is logic high and the node N1 is logic high, the NAND gate ND2 outputs a signal of logic low. Since the output signal of the NAND gate ND2 is inverted by the inverter INV6, the node N2 is logic high. Since the output signal of the inverter INV1 is also logic high, the NAND gate ND3 outputs a signal of logic low. Since the output signal of the NAND gate ND3 is inverted by the inverter INV7, the node N3 becomes logic high.

Since the output signal of the inverter INV1 is also logic high, the NAND gate ND4 outputs a signal of logic low. Since the output signal of the NAND gate ND4 is inverted by the inverter INV8, the node N4 becomes logic high. Since the output signal of the inverter INV1 is also logic high, the NAND gate ND5 outputs a signal of logic low. The signal of the NAND gate ND5 is input to one input terminal of the NAND gate ND1 via the inverter INV9. Since the output signal of the inverter INV9 is logic high and the output signal of the inverter INV1 is logic high, the NAND gate ND1 outputs a signal of logic low.

Accordingly, the all-bank select signal ref_all_bank is enabled high since the output signal of the NAND gate ND 1 is a signal inverted by the inverter INV2. Meanwhile, the single bank select signal ref_one_bank is disabled low since the output signal of the NAND gate ND1 is a signal that has been exposed to the inverters INV2, INV3.

As described above, after the chip select signal /CS1 is disabled and the chip is disabled, the all-bank select signal ref_all_bank that controls all the banks to be refreshed is enabled after a predetermined time (e.g., 200 ns) by the delay unit 112 elapses. At the same time, the single bank select signal ref_one_bank that controls only one bank to be refreshed is disabled.

Figure 3:
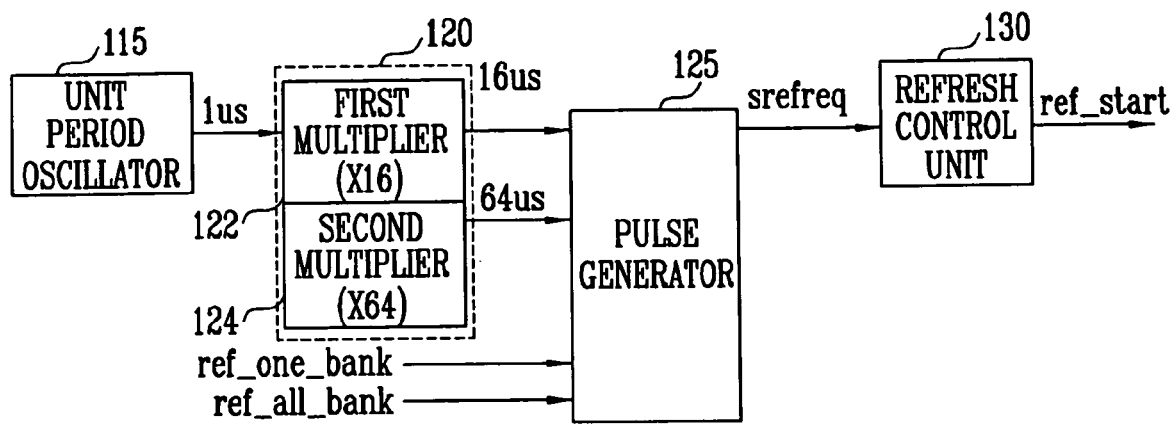
FIG. 3 is a block diagram of a circuit that generates a refresh start signal according to a preferred embodiment.

FIG. 3 is a block diagram of a circuit that generates a refresh start signal according to a preferred embodiment. Referring to FIG. 3, a unit period oscillator 115 generates a clock having a unit period Aµs (e.g., A is 1) in order to produce a refresh period, and provides the generated clock to a period multiplier 120. The unit period oscillator 115 can be comprised of a ring oscillator having an inverter and a delay element. The unit period oscillator 115 generates a unit period signal having a period of Aµs, and outputs the generated signal. Hereinafter, a case where the unit period is 1 µs will be described as an example.

The refresh period is an integral multiple of the unit period. An period multiplier 120 receives the output clock of the unit period oscillator 115 to generate a clock having a period of n*1 µs (where, n is an integer greater than 1, for example, n is an integer such as 16 or 64), and provides the generated clock to a pulse generator 125. The period multiplier 120 includes a first multiplier 122 and a second multiplier 124. The first multiplier 122 can be a multiplier that uses the output clock of the unit period oscillator 115 to generate a clock having a first period (e.g., a period of 16 µs). The second multiplier 122 can be a multiplier that uses the output clock of the unit period oscillator 115 to generate a clock having a second period (e.g., a period of 64 µs), which is greater than the first period.

The pulse generator 125 uses the output clocks of the first and second period multiplier 120, the single bank select signal ref_one_bank, and the all-bank select signal ref_all_bank, and provides a refresh request signal srefreq to a refresh control unit 130. The refresh request signal srefreq is a pulse signal, which is generated every period if the refresh period is decided. The refresh control unit 130 uses the refresh request signal srefreq to generate a refresh start signal ref_start. The refresh start signal ref_start is a signal to inform that refresh begins according to the refresh request signal srefreq.

Figure 4:
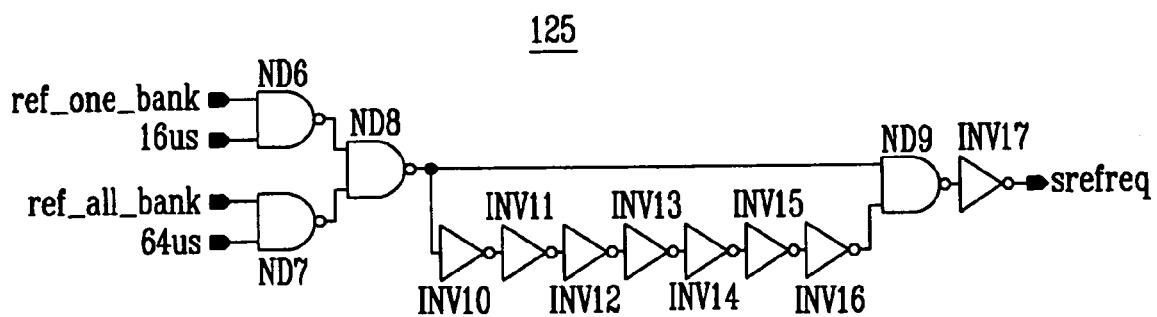
FIG. 4 is a circuit diagram of a pulse generator shown in FIG. 3.

FIG. 4 is a circuit diagram of the pulse generator 125 shown in FIG. 3. Referring to FIG. 4, the pulse generator 125 includes a NAND gate ND6 that performs a NAND operation on the single bank select signal ref_one_bank and the period clock (16 µs) being the output of the first multiplier, a NAND gate ND7 that performs a NAND operation on the all-bank select signal ref_all_bank and the period clock (64 µs) being the output of the second multiplier, and a NAND gate ND8 that performs a NAND operation on the output signal of the NAND gate ND6 and the output signal of the NAND gate ND7. The output signal of the NAND gate ND8 is input to one input terminal of a NAND gate ND9, and the output signal of the NAND gate ND8 is input to the other input terminal of the NAND gate ND9 through a plurality of odd-numbered inverters INV10, INV11, INV12, INV13, INV14, INV15 and INV16.

The NAND gate ND9 performs a NAND operation on the output signal of the NAND gate ND8 and the signal through the plurality of the odd-numbered inverters INV10 to INV16. The output signal of the NAND gate ND9 is input to an inverter INV17, and the inverter INV17 outputs the refresh request signal srefreq. The pulse generator 125 outputs the refresh request signal srefreq having the first period (e.g., a period of 16 µs) when the single bank select signal ref_one_bank is enabled, and outputs the refresh request signal having the second period (e.g., a period of 64 µs) when the all-bank select signal ref_all_bank is enabled.

The operation of the pulse generator will be below described with reference to FIGS. 3, 4 and 7. If the chip select signal /CS1 is disabled high, the all-bank select signal ref_all_bank shifts from logic low to logic high after being delayed for a predetermined time by the delay unit 112 of FIG. 2, and at the same time, the single bank select signal ref_one_bank shifts from logic high to logic low. The NAND gate ND6 performs a NAND operation on the single bank select signal ref_one_bank of logic low and the period clock (16 us) to always output a signal of logic high. The NAND gate ND7 performs a NAND operation on the all-bank select signal ref_all_bank of logic high and the period clock (64 us) to output a clock having a period of 64 us. Since the output signal of logic high of the NAND gate ND6 is input to one input terminal of the NAND gate ND8, the output signal of the NAND gate ND8 depends upon the output signal of the NAND gate ND7. Accordingly, the NAND gate ND8 outputs a clock having the 64 us period.

The NAND gate ND9 performs a NAND operation on the output signal of the NAND gate ND8 and the output signal of the NAND gate ND8, which is inverted through the inverters INV10 to INV16. The output signal of the NAND gate INV9 is input to the inverter INV17, and the inverter INV17 generates the refresh request signal srefreq having a pulse period of 64 µs.

If the same principle is applied, although the chip select signal /CS1 is enabled low or the chip select signal /CS1 is disabled high, the refresh request signal srefreq has a pulse width of 16 µs before it is delayed for a predetermined time by means of the delay unit 112 of FIG. 2.

As described above, if the all-bank select signal ref_all_bank is enabled, the refresh request signal srefreq is set to have a pulse period of 64 µs. If the single bank select signal ref_one_bank is enabled, the refresh request signal srefreq has a pulse period of 16 µs. The refresh request signal srefreq is input to the refresh control unit 130 that controls the refresh operation. The refresh control unit 130 that received the refresh request signal srefreq generates the refresh start signal ref_start being a signal for performing the refresh operation. The refresh start signal ref_start ha the same pulse period as that of the refresh request signal srefreq.

Figure 5:
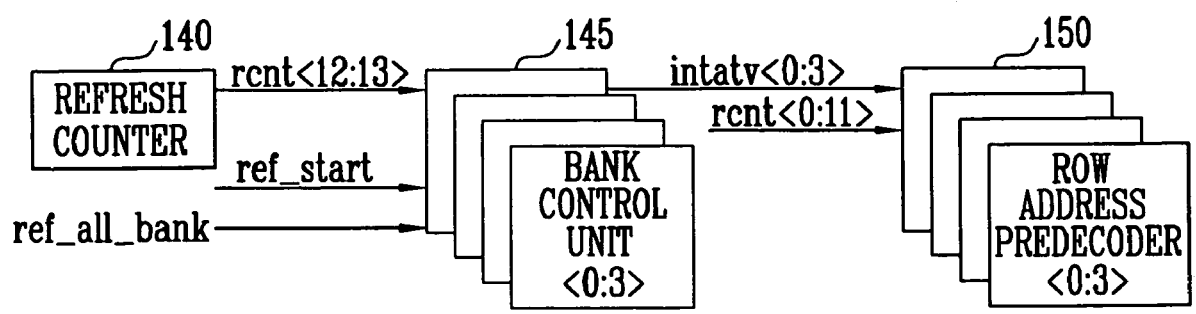
FIG. 5 is a block diagram for explaining a method of controlling a bank to be refreshed.
Figure 6A:
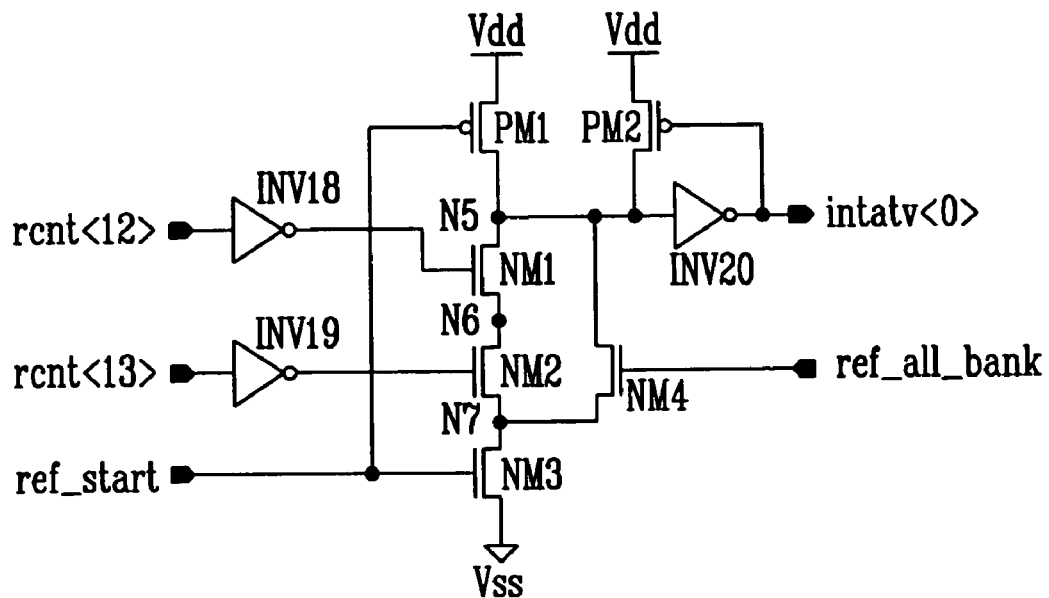
FIGS. 6a to 6d are circuits of the bank control unit.
Figure 6B:
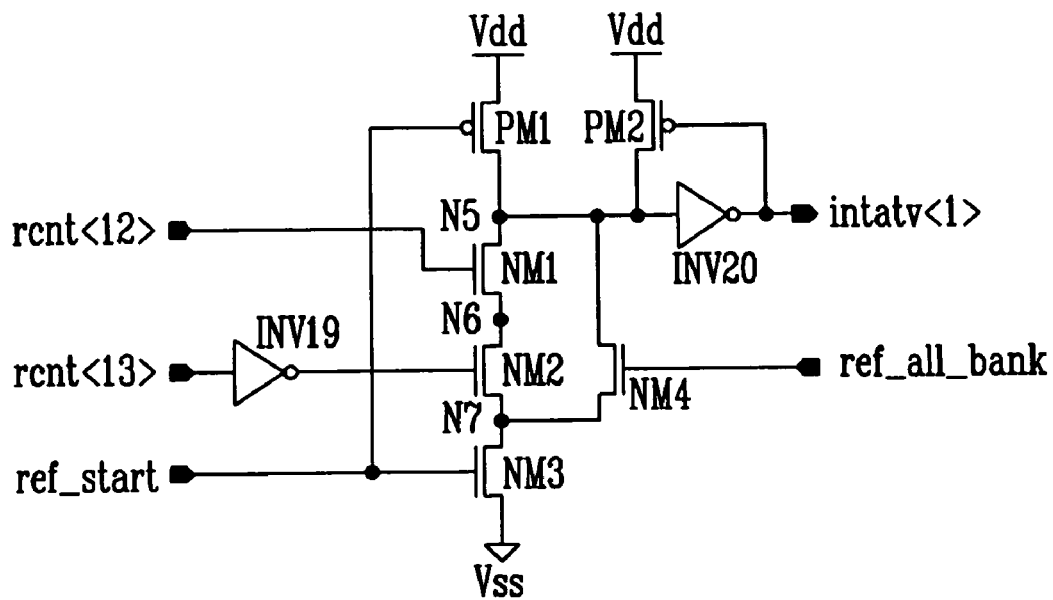
Figure 6C:
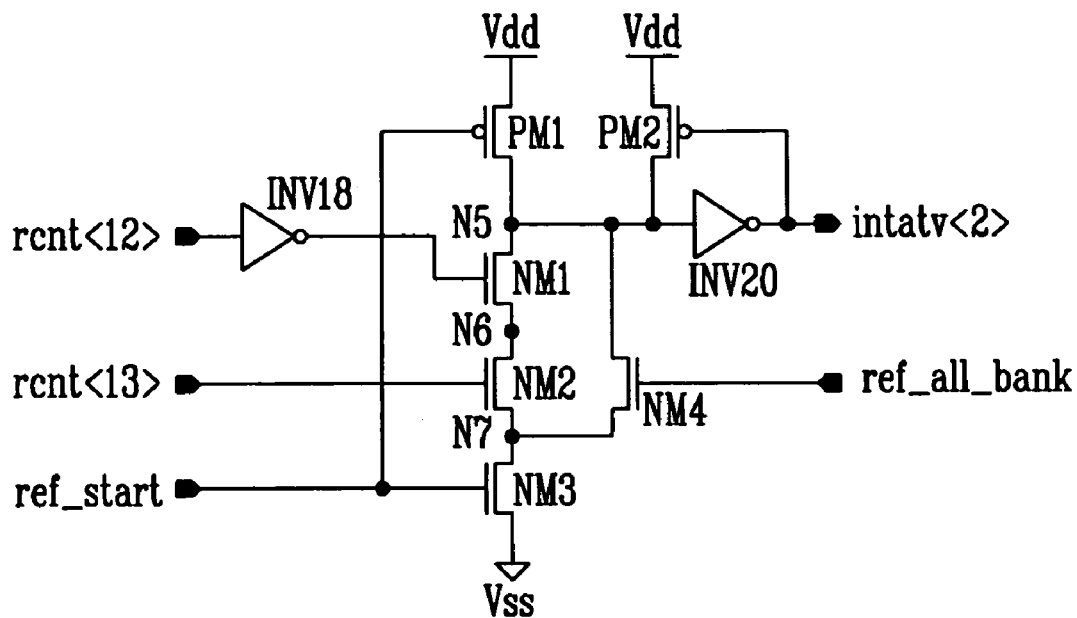
Figure 6D:
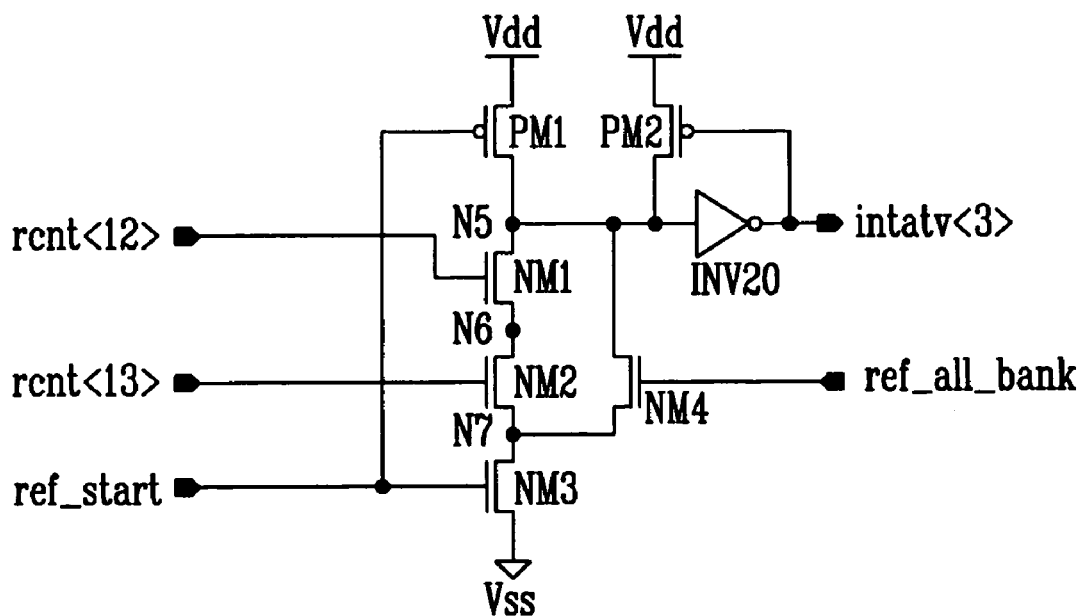

FIG. 5 is a block diagram for explaining a method of controlling banks to be refreshed. Referring to FIG. 5, a counter output signal rcnt<12:13> output from the refresh counter 140 is input to a bank control unit 145 that will perform refresh. The counter output signal rcnt<12:13> is a signal for selecting a bank among the refresh counter output signals. To the bank control unit 145 is also input the refresh start signal ref_start and the all-bank select signal ref_all_bank. The bank control unit 145 outputs a bank control signal intatv<0:3> in response to the counter output signal rcnt<12:13>, the refresh start signal ref_start, and the all-bank select signal ref_all_bank. The bank control signal intatv<0:3> and the counter output signal rcnt<0:11> are input to a row address predecoder 150. A precharge operation is performed on word lines of a bank selected by the row address predecoder 150. The counter output signal rcnt<0:13> is a 14-bit internal counter output signal for sequentially obtaining refresh addresses.

The bank control unit 145 enables the entire bank control signals intatv<0>, intatv<1>, intatv<2> and intatv<3> so that refresh is performed in all the banks regardless of the counter output signal rcnt<12:13> being a signal for selecting a bank upon refresh, if the all-bank select signal ref_all_bank is enabled. The bank control signal intatv<0:3> is a signal to inform a bank to be refreshed. If the all-bank select signal ref_all_bank is enabled, a refresh operation is performed on word lines W/L at the same location of all the banks by means of the bank control signals intatv<0>, intatv<1>, intatv<2> and intatv<3>.

Furthermore, the bank control unit 145 enables a bank control signal of one of the bank control signals intatv<0>, intatv<1>, intatv<2> and intatv<3> so that refresh is performed in one bank if the single bank select signal ref_one_bank is enabled. Thus, a refresh operation is performed on word lines W/L of corresponding one bank by means of the enabled bank control signal.

FIGS. 6a to 6d is a circuit diagram of the bank control unit. Referring to FIGS. 6a to 6d, a PMOS transistor PM1, which is controlled according to the refresh start signal ref_start, is connected between a power supply voltage terminal Vdd and a node N5. A NMOS transistor NM1, which is controlled according to an inverted signal of a counter output signal rcnt<12> through an inverter INV18, is connected between the node N5 and a node N6. A NMOS transistor NM2, which is controlled according to an inverted signal of a counter output signal rcnt<13> through an inverter INV19, is connected between the node N6 and a node N7. A NMOS transistor NM3, which is controlled according to the refresh start signal ref_start, is connected between the node N7 and a ground voltage terminal Vss.

Furthermore, a PMOS transistor PM2 is connected between a power supply voltage terminal Vdd and the node N5. The PMOS transistor PM2 is controlled according to an inverted voltage level of a voltage level of the node N5 through an inverter INV20. A NMOS transistor NM4, which is controlled according to the all-bank select signal ref_all_bank, is connected between the node N5 and the node N7. The inverter INV20 inverts the voltage level of the node N5 to output the bank control signals intatv<0:3>. The bank control signals intatv<0:3> have a voltage level opposite to that of the node N5. The bank control unit 145 enables a bank control signal corresponding to a bank to be refreshed among bank control signals if the single bank select signal ref_one_bank is enabled, but enables all bank control signals if the all-bank select signal ref_all_bank is enabled.

Hereinafter, the operation of the bank control unit will be described in detail with reference to FIGS. 5, 6a to 6d and 7. If the all-bank select signal ref_all_bank is enabled a logic high, the NMOS transistor NM4 is turned on. If the refresh start signal ref_start being a signal to inform the start of refresh is toggled as logic high, the NMOS transistor NM3 is turned on, and the node N5 becomes a ground voltage level. Thereby, the entire bank control signals intatv<0>, intatv<1>, intatv<2> and intatv<3> having a voltage level opposite to that of the node N5 are toggled high, and a refresh operation is performed on word lines at the same location of all the banks (Bank<0>, Bank<1>, Bank<2> and Bank<3> in FIG. 7) by means of the bank control signals intatv<0>, intatv<1>, intatv<2> and intatv<3>.

If this is summarized, if the all-bank select signal ref_all_bank is enabled high, the entire bank control signals intatv<0>, intatv<1>, intatv<2> and intatv<3> are enabled, and a refresh operation is performed in all the banks (e.g., Bank<0>, Bank<1>, Bank<2> and Bank<3> in FIG. 7) regardless of the counter output signal rcnt<12:13>.

Meanwhile, if the single bank select signal ref_one_bank is enabled high, the all-bank select signal ref_all_bank is disabled as low, and the NMOS transistor NM4 is turned off. Since the counter output signals rcnt<12> and rcnt<13> are logic low, the NMOS transistors NM1 and NM2 are turned on. If the refresh start signal ref_start being a signal informing the start of refresh is toggled high, the NMOS transistor NM3 is turned on, and the node N5 becomes a ground voltage level. Accordingly, one (e.g., intatv<0>) of the bank control signals intatv<0>, intatv<1>, intatv<2> and intatv<3> having an voltage level opposite to that of the node N5 is toggled high. A refresh operation is thus performed on word lines of a corresponding bank according to the bank control signal intatv<0>.

In an operational timing diagram shown in FIG. 7, a section "A" is an active operation section where the chip select signal /CS1 is enabled, and a refresh operation is performed on only one word line W/L of a corresponding bank to be refreshed. The same principle is applied even during a predetermined time (e.g., 200 ns) delayed by the delay unit 112 of FIG. 2 after the chip select signal /CS1 is disabled and the chip is thus disabled. A section "B" is a section needed to prevent an internal voltage drop from occurring when a chip is disabled for a short period of time. In most active operations, the chip select signal /CS1 is disabled shortly. In a standby mode, a time where the chip select signal /CS1 is disabled becomes long. This section is a section "C". A refresh operation is performed on all the banks from this time, and the period 64 μs also extends. It is thus possible to reduce current consumption ISB1 in a standby mode.

Figure 8:
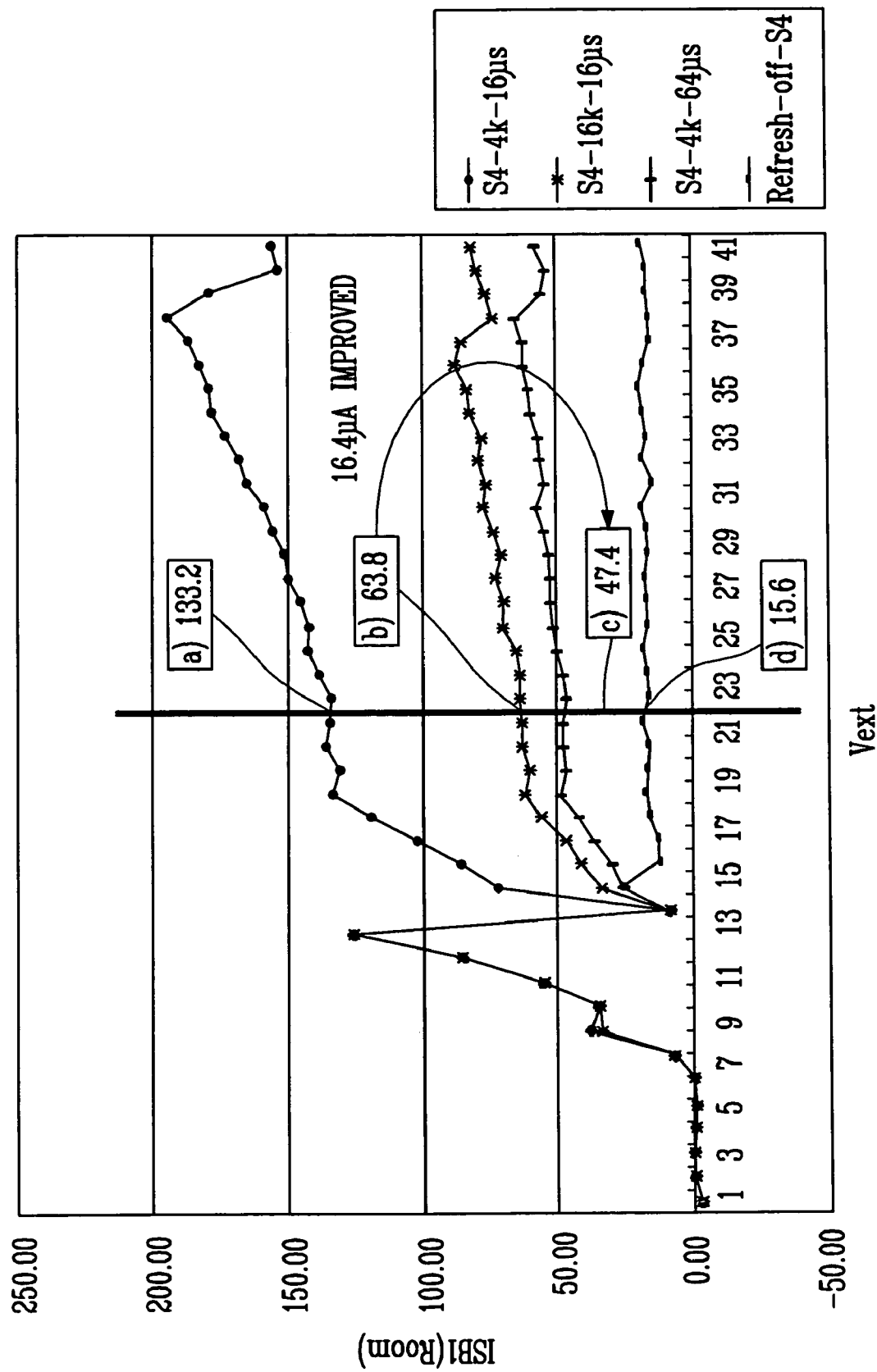
FIG. 8 is a graph of a test result depending upon refresh.

FIG. 8 shows a test result after the circuit according to the present invention is implemented on a chip. In FIG. 8, (a) is a case where refresh is performed on one bank by applying the 16 μs period after the chip is disabled even in a standby mode. (b) is a case where all bank are refreshed with the period being not extended by applying the period 16 μs. (c) is a case where all the banks refresh and the period 64 μs are applied. It can be seen that the standby current was reduced by 26 mμs. (d) is current flowing when refresh is not performed.

As described above, in a pseudo SRAM, the standby current when a chip is disabled can be reduced by 20 to 30%.

Although the foregoing description has been made with reference to the preferred embodiments, it is to be understood that changes and modifications may be made by one of ordinary skill in the art without departing from the spirit and scope of this disclosure and the appended claims.

What is claimed is:

1. A refresh control circuit in a pseudo SRAM including a plurality of banks, the refresh control circuit comprising:
  a chip select signal for selecting or not selecting a memory chip;
  an input buffer for buffering the chip select signal;

a buffer enable control unit that outputs a chip select internal control signal having an opposite phase to that of the chip select signal in response to an output signal of the input buffer; and a bank selection unit for determining whether to perform a refresh operation on one bank or all the banks in response to the output signal of the buffer enable control unit, wherein the refresh operation is performed on the one bank or all the banks at the same time depending upon a single bank select signal or an all-bank select signal.

2. The refresh control circuit as claimed in claim 1, wherein the bank selection unit enables the single bank select signal for performing the refresh operation on the one bank in a period where the chip select signal is enabled, or a period before a time for reading or writing one data elapses after the chip select signal is disabled, and the bank selection unit also enables the all-bank select signal for performing the refresh operation on all the banks in a period after a time for reading or writing one data elapses after the chip select signal is disabled.

3. The refresh control circuit as claimed in claim 2, wherein the bank selection unit comprises:
   a first inverter that receives the chip select internal control signal;
   a delay unit that delays an output signal of the first inverter as much as a time for reading or writing at least one data;
   a NAND gate that logically combines the output signals of the first inverter and an output signal of the delay unit;
   a second inverter that uses an output signal of the NAND gate to produce the all-bank select signal; and
   a third inverter that inverts an output signal of the second inverter to produce the single bank select signal.

4. The refresh control circuit as claimed in claim 1, wherein the pseudo SRAM comprises:
   a unit period oscillator for generating a clock having a unit period;
   a first period multiplier that multiplies the clock output from the unit period oscillator to produce a first clock having a first period;
   a second period multiplier that multiplies the clock output from the unit period oscillator to produce a second clock having a second period greater than the first period;
   a pulse generator that outputs a pulse in response to the first clock having the first period, the single bank select signal, the second clock having the second period and the all-bank select signal; and
   a refresh control unit that outputs a refresh start signal informing the start of the refresh operation in response to the pulse generator,
   wherein the pulse generator outputs a first pulse having the first period if the single bank select signal is enabled, and the pulse generation outputs a second pulse having the second period if the all-bank select signal is enabled.

5. The refresh control circuit as claimed in claim 4, wherein the first period multiplier is a multiplier that outputs the first clock having the first period in which the unit period is multiplied by 16, and the second period multiplier is a multiplier that outputs the second clock having the second period in which the unit period is multiplied by 64.

6. The refresh control circuit as claimed in claim 4, wherein the pulse generator comprises:

a first NAND gate for logically combining the single bank select signal and the first clock having the first period, and outputting a result;

a second NAND gate for logically combining the all-bank select signal and the second clock having the second period, and outputting a result;

a third NAND gate for logically combining an output signal of the first NAND gate and an output signal of the second NAND gate, and outputting a result;

a plurality of odd-numbered inverters that receive an output signal of the third NAND gate;

a fourth NAND gate for logically combining the output signal of the third NAND gate and an output signal of a last inverter among the plurality of the odd-numbered inverters; and an inverter for inverting an output signal of the fourth NAND gate to produce the pulse.

7. The refresh control circuit as claimed in claim 4, wherein the pseudo SRAM further comprises a bank control unit that outputs bank control signals indicating which banks to be refreshed in response to counter output signals output from a refresh counter, the refresh start signal and the all-bank select signal,
   wherein the bank control unit enables a bank control signal corresponding to a bank to be refreshed among the bank control signals if the single bank select signal is enabled, and enables the entire bank control signals if the all-bank select signal is enabled, whereby the refresh operation is performed depending upon the bank control signals output from the bank control unit.

8. The refresh control circuit as claimed in claim 7, wherein the bank control unit comprises:
   a first PMOS transistor controlled according to the refresh start signal and connected between a power supply voltage terminal and a first node;
   a first NMOS transistor controlled according to the counter output signal and connected between the first node and a second node;
   a second NMOS transistor controlled according to the counter output signal and connected between the second node and a third node;
   a third NMOS transistor controlled according to the refresh start signal and connected between the third node and a ground voltage terminal;
   a second PMOS transistor controlled according to an inverted signal of a voltage level of the first node and connected between the power supply voltage terminal and the first node;
   a fourth NMOS transistor controlled according to the all-bank select signal and connected between the first node and the third node; and
   an inverter that inverts the output signal of the first node to produce the bank control signals.

9. A refresh control circuit in a pseudo SRAM including a plurality of banks, the refresh control circuit comprising:
   a chip select signal for selecting or not selecting a memory chip;
   an input buffer for buffering the chip select signal;
   a buffer enable control unit that outputs a chip select internal control signal having an opposite phase to that of the chip select signal in response to an output signal of the input buffer; and
   a bank selection unit for determining whether to perform a refresh operation on one bank or all the banks in response to the output signal of the buffer enable control unit, wherein the refresh operation is performed on one bank or all the banks at the same time depending upon a single bank select signal or an all-bank select signal, and wherein the bank selection unit enables the single bank select signal for performing the refresh operation on the one bank in a period where the chip select signal is enabled, or a period before a time for reading or writing data elapses after the chip select signal is disabled, and the bank selection unit also enables the all-bank select signal for performing the refresh operation on all the banks in a period after a time for reading or writing data elapses after the chip select signal is disabled, and wherein the bank selection unit comprises:

a first inverter that receives the chip select internal control signal;

a delay unit that delays an output signal of the first inverter as much as a time for reading or writing at least one data;

a NAND gate that logically combines the output signals of the first inverter and an output signal of the delay unit;

a second inverter that uses an output signal of the NAND gate to produce the all-bank select signal; and a third inverter that inverts an output signal of the second inverter to produce the single bank select signal.

10. The refresh control circuit as claimed in claim 9, wherein the pseudo SRAM comprises:

a unit period oscillator for generating a clock having a unit period;

a first period multiplier that multiplies the clock output from the unit period oscillator to produce a first clock having a first period;

a second period multiplier that multiplies the clock output from the unit period oscillator to produce a second clock having a second period greater than the first period;

a pulse generator that outputs a pulse in response to the first clock having the first period, the single bank select signal, the second clock having the second period and the all-bank select signal; and a refresh control unit that outputs a refresh start signal informing the start of the refresh operation in response to the pulse generator, wherein the pulse generator outputs a first pulse having the first period if the single bank select signal is enabled, and the pulse generation outputs a second pulse having the second period if the all-bank select signal is enabled.

11. The refresh control circuit as claimed in claim 10, wherein the first period multiplier is a multiplier that outputs the first clock having the first period in which the unit period is multiplied by 16, and the second period multiplier is a multiplier that outputs the second clock having the second period in which the unit period is multiplied by 64.

12. The refresh control circuit as claimed in claim 10, wherein the pulse generator comprises:

a first NAND gate for logically combining the single bank select signal and the first clock having the first period, and outputting a result;

a second NAND gate for logically combining the all-bank select signal and the second clock having the second period, and outputting a result;

a third NAND gate for logically combining an output signal of the first NAND gate and the an output signal of the second NAND gate, and outputting a result;

a plurality of odd-numbered inverters that receive an output signal of the third NAND gate;

a fourth NAND gate for logically combining the output signal of the third NAND gate and an output signal of a last inverter among the plurality of the odd-numbered inverters; and an inverter for inverting an output signal of the fourth NAND gate to produce the pulse.

13. The refresh control circuit as claimed in claim 10, wherein the pseudo SRAM further comprises a bank control unit that outputs bank control signals indicating which banks to be refreshed in response to counter output signals output from a refresh counter, the refresh start signal and the all-bank select signal, wherein the bank control unit enables a bank control signal corresponding to a bank to be refreshed among the bank control signals if the single bank select signal is enabled, and enables the entire bank control signals if the all-bank select signal is enabled, whereby the refresh operation is performed depending upon the bank control signals output from the bank control unit.

14. The refresh control circuit as claimed in claim 13, wherein the bank control unit comprises:

a first PMOS transistor controlled according to the refresh start signal and connected between a power supply voltage terminal and a first node;

a first NMOS transistor controlled according to the counter output signal and connected between the first node and a second node;

a second NMOS transistor controlled according to the counter output signal and connected between the second node and a third node;

a third NMOS transistor controlled according to the refresh start signal and connected between the third node and a ground voltage terminal;

a second PMOS transistor controlled according to an inverted signal of a voltage level of the first node and connected between the power supply voltage terminal and the first node; a fourth NMOS transistor controlled according to the all-bank select signal and connected between the first node and the third node; and an inverter that inverts the output signal of the first node to produce the bank control signals.

15. A refresh control circuit in a pseudo SRAM including a plurality of banks, the refresh control circuit comprising:

a chip select signal for selecting or not selecting a memory chip;

an input buffer for buffering the chip select signal;

a buffer enable control unit that outputs a chip select internal control signal having an opposite phase to that of the chip select signal in response to an output signal of the input buffer; and a bank selection unit for determining whether to perform a refresh operation on one bank or all the banks in response to the output signal of the buffer enable control unit, wherein the refresh operation is performed on the one bank or all the banks at the same time depending upon a single bank select signal or an all-bank select signal, and wherein the bank selection unit enables the single bank select signal for performing the refresh operation on the one bank in a period where the chip select signal is enabled, or a period before a time for reading or writing one data elapses after the chip select signal is disabled, and the bank selection unit also enables the all-bank select signal for performing the refresh operation on all the banks in a period after a time for reading or writing one data elapses after the chip select signal is disabled.

16. The refresh control circuit as claimed in claim 15, wherein the pseudo SRAM comprises:
- a unit period oscillator for generating a clock having a unit period;
- a first period multiplier that multiplies the clock output from the unit period oscillator to produce a first clock having a first period;
- a second period multiplier that multiplies the clock output from the unit period oscillator to produce a second clock having a second period greater than the first period;
- a pulse generator that outputs a pulse in response to the first clock having the first period, the single bank select signal, the second clock having the second period and the all-bank select signal; and
- a refresh control unit that outputs a refresh start signal informing the start of the refresh operation in response to the pulse generator,
- wherein the pulse generator outputs a first pulse having the first period if the single bank select signal is enabled, and the pulse generation outputs a second pulse having the second period if the all-bank select signal is enabled.

17. The refresh control circuit as claimed in claim 16, wherein the first period multiplier is a multiplier that outputs the first clock having the first period in which the unit period is multiplied by 16, and the second period multiplier is a multiplier that outputs the second clock having the second period in which the unit period is multiplied by 64.

18. The refresh control circuit as claimed in claim 16, wherein the pulse generator comprises:
- a first NAND gate for logically combining the single bank select signal and the first clock having the first period, and outputting a result;
- a second NAND gate for logically combining the all-bank select signal and the second clock having the second period, and outputting a result;
- a third NAND gate for logically combining an output signal of the first NAND gate and an output signal of the second NAND gate, and outputting result;
- a plurality of odd-numbered inverters that receive an e output signal of the third NAND gate;
- a fourth NAND gate for logically combining the output signal of the third NAND gate and an output signal of a last inverter among the plurality of the odd-numbered inverters; and
- an inverter for inverting an output signal of the fourth NAND gate to produce the pulse.

19. The refresh control circuit as claimed in claim 16, wherein the pseudo SRAM further comprises a bank control unit that outputs bank control signals indicating which banks to be refreshed in response to counter output signals output from a refresh counter, the refresh start signal and the all-bank select signal,
- wherein the bank control unit enables a bank control signal corresponding to a bank to be refreshed among the bank control signals if the single bank select signal is enabled, and enables the entire bank control signals if the all-bank select signal is enabled, whereby the refresh operation is performed depending upon the bank control signals output from the bank control unit.

20. The refresh control circuit as claimed in claim 19, wherein the bank control unit comprises:
- a first PMOS transistor controlled according to the refresh start signal and connected between a power supply voltage terminal and a first node;
- a first NMOS transistor controlled according to the counter output signal and connected between the first node and a second node;
- a second NMOS transistor controlled according to the counter output signal and connected between the second node and a third node;
- a third NMOS transistor controlled according to the refresh start signal and connected between the third node and a ground voltage terminal;
- a second PMOS transistor controlled according to an inverted signal of a voltage level of the first node and connected between the power supply voltage terminal and the first node;
- a fourth NMOS transistor controlled according to the all-bank select signal and connected between the first node and the third node; and
- an inverter that inverts the output signal of the first node to produce the bank control signals.

* * * * *

UNITED STATES PATENT AND TRADEMARK OFFICE
CERTIFICATE OF CORRECTION

| | | |
|---|---|---|
| PATENT NO. | : 7,180,809 B2 | Page 1 of 1 |
| APPLICATION NO. | : 11/126420 | |
| DATED | : February 20, 2007 | |
| INVENTOR(S) | : Yin Jae Lee | |

It is certified that error appears in the above-identified patent and that said Letters Patent is hereby corrected as shown below:

In the Claims:

Column 13, line 64, "the an output" should be -- an output --.

Column 15, line 40, "outputting result" should be -- outputting the result --.

Column 15, line 41, "an e output" should be -- an output --.

Signed and Sealed this

Sixth Day of November, 2007

JON W. DUDAS
*Director of the United States Patent and Trademark Office*